(12) United States Patent
Buchanan, Jr.

(10) Patent No.: US 6,458,002 B1
(45) Date of Patent: Oct. 1, 2002

(54) REAR WIPER HATCH CASSETTE USING INTERLOCKING PARTS

(75) Inventor: Harry Charles Buchanan, Jr., Dayton, OH (US)

(73) Assignee: Valeo Electrical Systems, Inc., Auburn Hills, MI (US)

( * ) Notice: Subject to any disclaimer, the term of this patent is extended or adjusted under 35 U.S.C. 154(b) by 0 days.

(21) Appl. No.: 09/750,987

(22) Filed: Dec. 28, 2000

(51) Int. Cl.[7] .................................................. H01R 9/22
(52) U.S. Cl. ...................................................... 439/717
(58) Field of Search ................................ 439/717, 928; 361/729, 732, 801

(56) References Cited

U.S. PATENT DOCUMENTS

| | | | |
|---|---|---|---|
| 3,237,341 A | * | 3/1966 | Janning .......................... 446/91 |
| 4,097,113 A | * | 6/1978 | McKelvy ...................... 439/377 |
| 4,423,465 A | * | 12/1983 | Teng-Ching et al. ......... 361/394 |
| 4,580,861 A | * | 4/1986 | Kaley .......................... 439/594 |
| 4,972,289 A | * | 11/1990 | Springer ....................... 361/23 |
| 5,007,863 A | * | 4/1991 | Xuan .......................... 439/639 |
| 5,369,565 A | * | 11/1994 | Chen et al. .................. 363/146 |
| 6,193,550 B1 | * | 2/2001 | Yamashita et al. .......... 439/594 |

* cited by examiner

Primary Examiner—Brian Sircus
Assistant Examiner—Thanh-Tam Le
(74) Attorney, Agent, or Firm—J. Gordon Lewis

(57) ABSTRACT

A hatch assembly for a vehicle wherein the components to be installed within the tailgate or the hatch are interconnected. The components can include one or more of a wiper drive motor, a cargo light, a center high mounted stop light, a fluid sprayer, a latch, and the vehicle hatch. The assembly can include corresponding shaped features on respective components so that the components can be interconnected without the use of additional fasteners. Electrical connections are also made between the components of the assembly. The electrical connections are embedded within the walls of the components, the cover, and/or the shaped features that provide the mechanical connections between the enclosures.

23 Claims, 2 Drawing Sheets

REAR WIPER HATCH CASSETTE USING INTERLOCKING PARTS

FIELD OF THE INVENTION

The invention relates to housings having interlocking mechanical and electrical couplings for attaching to one another to eliminate the need for external wiring harnesses, and more particularly, to a rear hatch assembly for a vehicle having multiple components joined in an interlocking relationship relative to each other, providing mechanical and electrical connection between the components without requiring an external wiring harness extending between the components.

BACKGROUND OF THE INVENTION

A vehicle tailgate, or hatch, is a platform for many components and subsystems. The assembly of the various components and subsystems to the vehicle tailgate requires several hundred feet of a vehicle assembly line and numerous workers. The costs associated with line space and labor can be reduced if the various components could be assembled together and inserted into the hatch at one time, or assembled individually into the hatch without requiring external wiring harnesses extending therebetween or additional mechanical fasteners for separate attachment to the tailgate or hatch.

SUMMARY OF THE INVENTION

The present invention provides an apparatus for mechanically and electrically joining any combination of various components housed within a rear hatch assembly of a vehicle. The present invention allows the electrical and mechanical connections between the components to be made concurrently in a single assembly or installation step. The present invention includes a first enclosure, defined by at least one wall, and a cover. The wall of the enclosure can be shaped to include a protrusion. The protrusion of the first enclosure can be inserted into a mating aperture of a second enclosure to interlock the two enclosures. Electrical contacts can be positioned on the exterior surface of the protrusion and the interior surface of the aperture so that the first and second enclosures are electrically connected as well as mechanically connected when the protrusion is inserted in the aperture. Alternatively, the electrical connection between the second enclosure and the first enclosure can be embedded within the wall of the cover. The cover of the first enclosure can extend beyond the wall of the first enclosure to provide the electrical connection between the first and second enclosures in this configuration. Alternatively, the first and second enclosures can be mechanically connected during molding by placing a premolded enclosure with a preformed protrusion into a corresponding second mold for forming connected enclosures in a single molding die. The enclosures can be molded together while maintaining distinct chambers for different hatch assembly components. One or more covers can be used to enclose the enclosures formed in this manner. The electrical connections between the enclosures can be embedded in the walls separating the enclosures or within the cover or a combination of the two. For example, the cover can be used to connect or bridge separated contacts within the enclosures or formed on the walls of the enclosures. In another embodiment of the invention, the second enclosure can be molded with the cover. The connection between the first and second enclosure is made when the cover is placed over the first enclosure. A source of electrical power can be provided for operating the various components of the hatch assembly. An electrical control unit can also be provided for controlling the operation of the various components.

Other objects, advantages and applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENT

Figure 1:
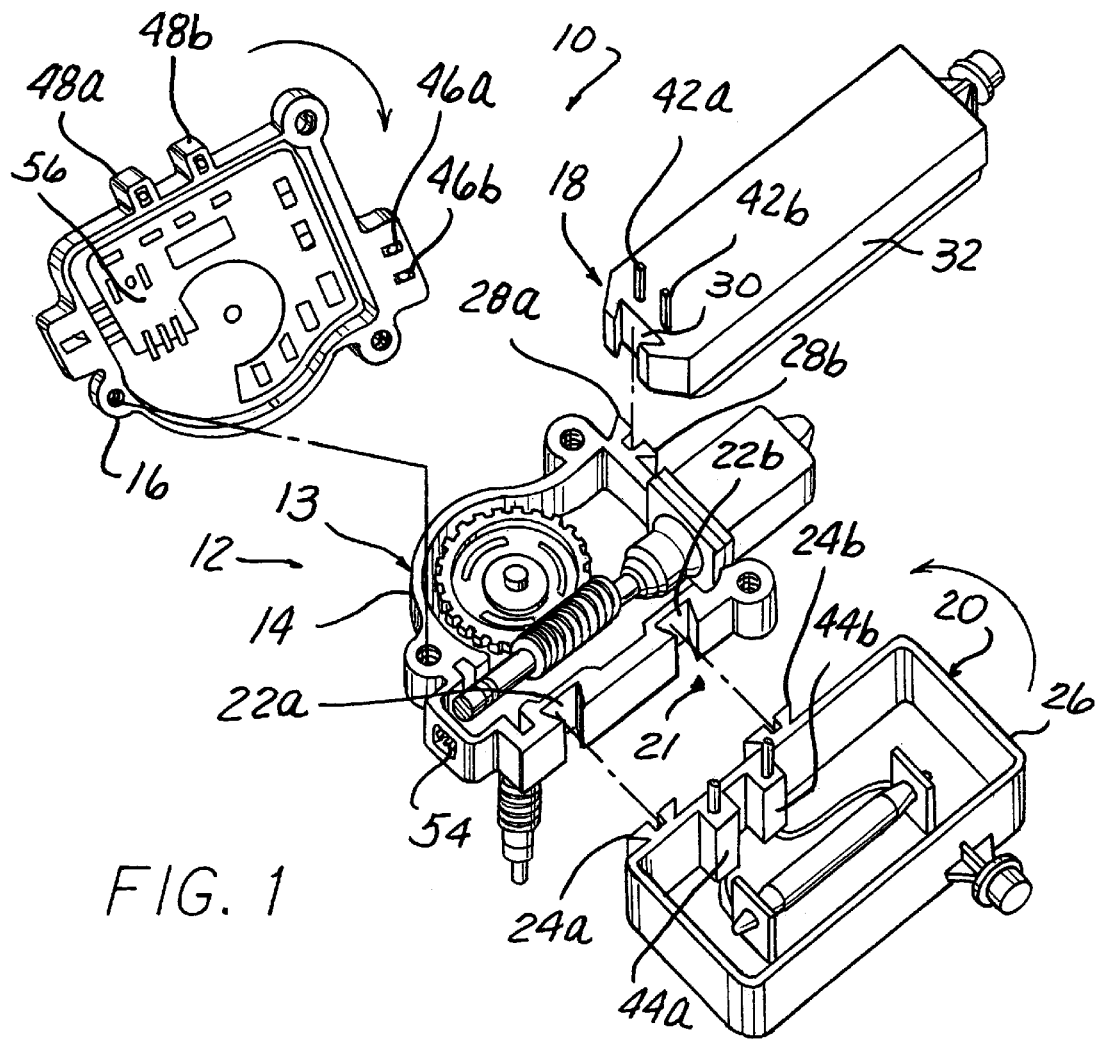
FIG. 1 is an exploded perspective view of an embodiment of the invention where mechanical connections between the components are provided by protrusions and apertures, while electrical connections between the components are provided by the cover.

The present invention includes one or more enclosures 12 having one or more housings 13 with one or more corresponding covers 16 where the enclosures are mechanically and electrically coupled to one another without requiring an external wiring harness extending there between. By way of example and not limitation, the present invention will be disclosed with respect to a hatch cassette assembly 10 for electrically coupling a plurality of electrical members with respect to one another. The assembly 10 includes at least one enclosure 12 defined by a housing 13 having at least one side wall 14 and a cover 16. The enclosure 12 can house a component for a rear hatch of a vehicle. In FIG. 1, the enclosure 12 houses a wiper drive for a windshield wiper. However, the enclosure 12 can house any of the components making up the hatch assembly 10. In FIG. 1, the enclosure 12 is connected to a center high mounted stop light or CHMSL 18, and a cargo light 20.

Figures 3, 4:
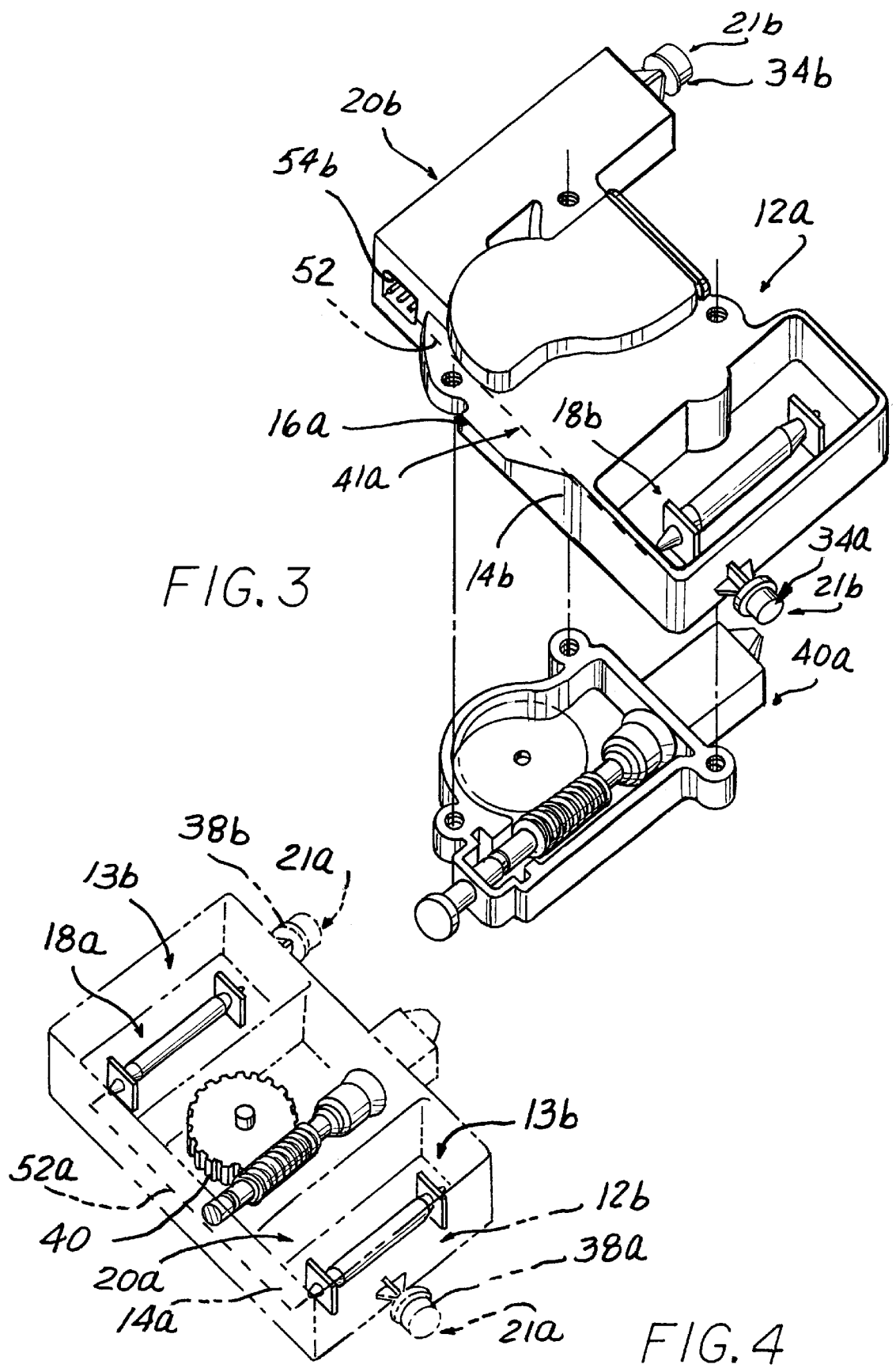
FIG. 3 is a perspective view of an embodiment of the invention where a plurality of sub enclosures are molded together in a single piece with one cover.
FIG. 4 is an exploded perspective view of an embodiment of the invention where adjacent enclosures are molded with the cover.

The assembly 10 includes shaped means 21 for joining the enclosure 12 with an adjacent enclosure, such as a CHMSL 18 or a cargo light 20 as is shown in FIG. 1. The adjacent enclosure can be a rear wiper drive for a windshield wiper, a cargo light, a CHMSL, a door latch, a fluid sprayer, or a vehicle hatch or any combination thereof. The enclosure 12 can be connected to more than one adjacent enclosure. The shaped means 21 is defined by the wall 14 of enclosure 12. In FIG. 1, the shaped means 21 is formed as a pair of apertures 22a and 22b. The apertures 22a and 22b are complementarily shaped to receive protrusions 24a and 24b, respectively formed on the wall 26 of the cargo light 20. Also, the shaped means 21 can take the form of protrusions 28a and 28b located on the wall 14 of the enclosure 12. The protrusions 28a and 28b can be received by an aperture 30 formed in a wall 32 of the CHMSL 18. The shaped means 21 can be of any shaped cross section that will facilitate an interlocking fit between the protrusion of one enclosure 12 and an adjacent complementary aperture of another enclosure. In FIG. 1, the shaped means 21 is formed in generally trapezoidal shaped protrusions 28a and 28b or apertures 22a and 22b. Alternatively, the shaped means 21 can include rectangular, cylindrical, or polygonal shaped cross sectional portions, or include accurate, angled, or curved surface portions, or any combination thereof to form interlocking shapes. In FIG. 3, the shaped means 21 is formed as vehicle mounts 34a and 34b.

The enclosure 12 can include multiple compartments. In FIG. 4 an enclosure 12b, having a wall 14a, is shown with a plurality of internal cavities or compartments 13b within the enclosure 12b to enclose one or more items, such as a CHMSL 18a, a wiper drive 40 and a cargo light 20a. The enclosure 12b includes shaped means 21a in the form of vehicle mounts 38a and 38b.

In FIG. 3, another embodiment of the assembly 10 is shown where multiple housings are joined to form the enclosure 12a. A CHMSL 18b and a cargo light 20b are connected to a single cover 16a and the cover 16a is connected to a wiper drive 40a. Vehicle mounts 34a and 34b form the shaped means 21b for connecting to an adjacent enclosure defined by a vehicle hatch.

Figure 2:
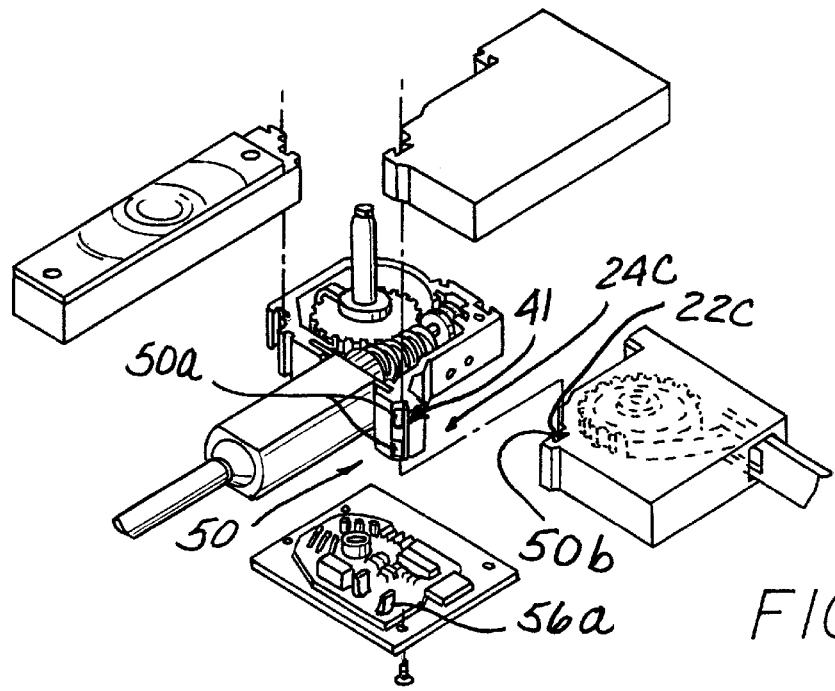
FIG. 2 is an exploded perspective view of an embodiment of the invention where electrical contacts are positioned on the protrusions and apertures allowing the mechanical and electrical connections between the components to be made concurrently.

Referring again to FIGS. 1 and 2, the assembly 10 of the present invention includes electrically conductive means 41 for electrically connecting adjacent enclosures when the enclosures are mechanically joined. The electrically conductive means 41 can include terminals 42a, 42b, 44a, and 44b, mateable with sockets 46a, 46b, 48a, and 48b. The electrically conductive means 41 can also include electric contacts 50, as are shown in FIG. 2. Contact 50a, positioned on a protrusion 24c, operably engages contact 50b positioned within or adjacent aperture 22c when the protrusion 24c is mechanically coupled within aperture 22c. The electrically conductive means 41 extends adjacent to or through the shaped means 21 to form the connection in response to forming the mechanical connection between adjacent enclosures, or the mechanical connection between the cover and the housing or any combination thereof. The electrically conductive means 41 is preferably embedded within the wall 14 of the housing or within the wall of the cover. As shown in FIG. 3, the electrically conductive means 41a can be formed as conduits or wires 52 passing through the wall 14b of the enclosure 12a. The electrically conductive means 41a can also extend through or be embedded within the cover 16. In FIG. 4, the electrically conductive means can take the form of conduits, contacts or wire 52a mounted on or through the walls of the housing or cover of each enclosure.

The assembly 10 of the present invention can also include a connector or electrical socket 54, as shown in FIG. 1, to connect the assembly 10 to an external power source or wiring harness. The connector 54 can be positioned at any location on the assembly 10 and the electrically conductive means 41 can be positioned accordingly to provide current to all of the components of the assembly 10. In FIG. 3 an alternative configuration of the connector is shown where the connector 54b is formed integral with the side wall 14b.

The assembly 10 can also include control means 56 for controlling the operation of the electrical components of the assembly 10. In FIG. 1, a control means 56 is shown mounted on the cover 16. The control means 56 can control the flow of electric current to the CHMSL 18 and the cargo light 20 or any other adjacent enclosure connected to the enclosure 12. The control means 56 can be positioned at any location on the assembly 10. It can be desirable to position the control means 56 adjacent to the connector 54. In FIG. 2, control means 56a is also shown mounted to the cover 16.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An apparatus for electrically coupling a plurality of electrical members with respect to one another and with respect to an electrical system of a motor vehicle, the motor vehicle having inner and outer body panels defining a hollow compartment therebetween, the apparatus comprising:

least one enclosure defined by at least one side wall and at least one cover, and positionable within the hollow compartment between the inner and outer body panels of the motor vehicle;

shaped means, defined by the at least one side wall formed integral with the enclosure, for releasably interlocking with another adjacent enclosure, the shaped interlocking means including at least one of a coupling portion and a complementary receiving portion, the coupling portion of one enclosure connectible with the receiving portion of all adjacent enclosure; and electrically conductive means, extending within at least one of the shaped means and the cover, for electrically connecting adjacent enclosures with respect to one another.

2. The apparatus of claim 1 wherein the at least one shaped interlocking means further comprises:

one of the enclosures having a protrusion; and another of the enclosures having an aperture, the aperture having a complementary shape with respect to the protrusion.

3. The apparatus of claim 1 wherein the coupling portion of one enclosure is releasibly connectible with the receiving portion of an adjacent enclosure.

4. The apparatus of claim 1 wherein the electrically conductive means electrically connects adjacent enclosures when the coupling and the complementary receiving portion of the adjacent enclosures are releasibly connected.

5. The apparatus of claim 1 wherein at least one of the enclosures is selected from the group including a rear wiper drive for a windscreen wiper, a cargo light, a center high mounted stop light, a door latch, a fluid sprayer, and a vehicle hatch.

6. The apparatus of claim 1 wherein the at least one enclosure further comprises:

a plurality of interconnectible enclosures defining electrical housings for electrical members of an automotive rear hatch assembly, and connectible to be powered by a single plug-in connector of the electrical system of the motor vehicle.

7. The apparatus of claim 1 wherein the electrically conductive means further comprises:

electrical conductors extending through the coupling portion and the receiving portion of adjacent enclosures for delivery of electrical power to an electrical member enclosed within each of the enclosures.

8. The apparatus of claim 7 wherein the electrically conductive means further comprises:

the coupling portions and the receiving portions of adjacent enclosures engageable in electrical communication with one another for delivery of electrical power to an electrical member enclosed within at least one of the enclosures.

9. The apparatus of claim 1 wherein the electrically conductive means further comprises:

electronic control means for controlling an electrical member enclosed within at least one of the enclosures.

10. An apparatus for electrically coupling a plurality of electrical members with respect to one another and with respect to an electrical system of a motor vehicle, the motor vehicle having inner and outer body panels defining a hollow compartment therebetween, the apparatus comprising:

at least one enclosure defined by at least one side wall and at least one cover, and positionable within the hollow compartment between the inner and outer body panels of the motor vehicle;

shaped means, defined by the at least one side wall formed integral with the enclosure, for releasibly interlocking with another adjacent enclosure, the shaped interlocking means including at least one of a coupling portion and a complementary receiving portion, the coupling portion of one enclosure connectible with the receiving portion of an adjacent enclosure; and electrically conductive means, extending through the shaped interlocking means, for electrically connecting electrical members within adjacent enclosures with respect to an electrical power source and one another.

11. The apparatus of claim 1 further comprising a plurality of shaped interlocking means, each shaped interlocking means operable to releasibly interlock the at least one enclosure with at least one adjacent enclosure.

12. An apparatus for electrically coupling a plurality of electrical members with respect to one another comprising:

at least one enclosure defined by at least one side wall and at least one cover, wherein the cover is operable to enclose the at least one enclosure and at least one adjacent enclosure:

shaped means, defined by the at least one side wall formed integral with the enclosure, for releasibly interlocking with another adjacent enclosure, the shaped interlocking means including at least one of a coupling portion and a complementary receiving portion, the coupling portion of one enclosure connectible with the receiving portion of an adjacent enclosure; and electrically conductive means, extending within at least one of the side wall and the cover, for electrically connecting adjacent enclosures with respect to one another.

13. An apparatus for electrically coupling a plurality of electrical members with respect to one another and with respect to an electrical system of a motor vehicle, the motor vehicle having inner and outer body panels defining a hollow compartment therebetween, the apparatus comprising:

an enclosure for a rear wiper drive, the enclosure defined by at least one side wall and at least one cover, and positionable within the hollow compartment between the inner and outer body panels of the motor vehicle;

shaped means, defined by the at least one side wall formed integral with the enclosure, for releasibly interlocking with at least one adjacent enclosure, the shaped interlocking means including at least one of a coupling portion and a complementary receiving portion, the coupling portion of one enclosure releasibly connectible with the receiving portion of an adjacent enclosure; and electrically conductive means, extending within the at least one cover, for electrically connecting adjacent enclosures when the coupling portion and the complementary receiving portion of the adjacent enclosures are releasibly connected with respect to one another.

14. The apparatus of claim 13 wherein the at least one adjacent enclosure houses an electrical member selected from the group including a cargo light, a center high mounted stop light, a door latch, a wiper light, a fluid sprayer, and a vehicle hatch.

15. An apparatus for electrically coupling a plurality of electrical members with respect to one another and with respect to an electrical system of a motor vehicle, the motor vehicle having inner and outer body panels defining a hollow compartment therebetween, the apparatus comprising:

an enclosure for a rear wiper drive, the enclosure defined by at least one side wall and at least one cover, and positionable within the hollow compartment between the inner and outer body panels of the motor vehicle;

shaped means, defined by the at least one side wall formed integral with the enclosure, for releasibly interlocking with at least one adjacent enclosure, the shaped interlocking means including at least one of a coupling portion and a complementary receiving portion, the coupling portion of one enclosure releasibly connectible with the receiving portion of an adjacent enclosure; and electrically conductive means, extending within at least one of the side wall and the cover, for electrically connecting adjacent enclosures when the coupling portion and the complementary receiving portion of the adjacent enclosures are releasibly connected with respect to one another, one of the enclosures having at least one aperture formed therein and another of the enclosures having at least one complementary shaped protrusion formed therein, the enclosures mechanically and electrically connected to one another by moving the at least one aperture to operably engage with respect to the at least one protrusion to interlock the enclosures with respect to one another while electrically powering the electrical members housed within the enclosures through the shaped interlocking means.

16. The apparatus of claim 13 further comprising:

a plurality of interconnected enclosures defining electrical housings for electrical members of an automotive rear batch assembly, and connectible to be powered by a single plug-in connector of the electrical system of the motor vehicle.

17. The apparatus of claim 13 wherein the electrically conductive means further comprises:

electrical power means for conducting electrical power between each of the enclosures.

18. The apparatus of claim 17 wherein the electrically conductive means further comprises:

the at least one cover for delivery of electrical power to an electrical member enclosed within each of the enclosures.

19. The apparatus of claim 13 wherein the electrically conductive means farther comprises:

electric control means for controlling at least one of the electrical members enclosed within at least one of the enclosures.

20. An apparatus for electrically coupling a plurality of electrical members with respect to one another and with respect to an electrical system of a motor vehicle, the motor vehicle having inner and outer body panels defining a hollow compartment therebetween, the apparatus comprising:

an enclosure for a rear viper drive, the enclosure defined by at least one side wall and at least one cover, and positionable within the hollow compartment between the inner and outer body panels of the motor vehicle;

shaped means, defined by the at least one side wall formed integral with the enclosure, for releasably interlocking with at least one adjacent enclosure, the shaped interlocking means including at least one of a coupling portion and a complementary receiving portion, the coupling portion of one enclosure releasibly connectible with the receiving portion of an adjacent enclosure; and electrically conductive means, extending within at least one of the side wall and the cover, for electrically connecting adjacent enclosures when the coupling portion and the complementary receiving portion of the adjacent enclosures are releasibly connected with respect to one another, wherein the electrically conducting means extend through the shaped interlocking means.

21. The apparatus of claim 13 further comprising a plurality of shaped interlocking means, each shaped means operable to releasibly interlock the at least one enclosure with at least one adjacent enclosure.

22. An apparatus for electrically coupling a plurality of electrical members with respect to one another comprising:

an enclosure for a rear wiper drive, the enclosure defined by at least one side wall and at least one cover, wherein the cover is operable to enclose the at least one enclosure and at least one adjacent enclosure;

shaped means, defined by the at least one side wall formed integral with the enclosure, for releasibly interlocking with at least one adjacent enclosure, the shaped interlocking means including at least one of a coupling portion and a complementary receiving portion, the coupling portion of one enclosure releasibly connectible with the receiving portion of an adjacent enclosure; and electrically conductive means, extending within at least one of the side wall and the cover, for electrically connecting adjacent enclosures when the coupling portion and the complementary receiving portion of the adjacent enclosures are releasibly connected with respect to one another.

23. An apparatus for electrically coupling a plurality of electrical members with respect to one another and with respect to an electrical system of a motor vehicle, the motor vehicle having inner and outer body panels defining a hollow compartment therebetween, the apparatus comprising an enclosure for a rear wiper drive, the enclosure defined by at least one side wall and at least one cover, and positionable within the hollow compartment between the inner and outer body panels of the motor vehicle;

at least one of a coupling portion defining a protrusion and a complementary receiving portion defining an aperture, defined by the at least one side wall formed integral with the enclosure, for releasibly interlocking with at least one adjacent enclosure, the coupling portion of one enclosure releasibly connectible with the receiving portion of an adjacent enclosure; and electrically conductive means, extending within at least one of the side wall and the cover, for electrically connecting adjacent enclosures when the coupling portion and the complementary receiving portion of the adjacent enclosures are releasibly connected with respect to one another.

* * * * *